(12) United States Patent
Ichikawa

(10) Patent No.: US 11,193,218 B2
(45) Date of Patent: Dec. 7, 2021

(54) SPUTTERING EQUIPMENT AND METHOD OF MANUFACTURING SEMICONDUCTOR DEVICE

(71) Applicant: DENSO CORPORATION, Kariya (JP)

(72) Inventor: Shuhei Ichikawa, Nisshin (JP)

(73) Assignee: DENSO CORPORATION, Kariya (JP)

( * ) Notice: Subject to any disclaimer, the term of this patent is extended or adjusted under 35 U.S.C. 154(b) by 94 days.

(21) Appl. No.: 16/811,090

(22) Filed: Mar. 6, 2020

(65) Prior Publication Data
US 2020/0308725 A1 Oct. 1, 2020

(30) Foreign Application Priority Data

Mar. 29, 2019 (JP) .............................. JP2019-067376

(51) Int. Cl.
H01L 21/20 (2006.01)
C30B 29/16 (2006.01)
C30B 23/02 (2006.01)
H01L 21/02 (2006.01)
C30B 35/00 (2006.01)

(52) U.S. Cl.
CPC .............. C30B 29/16 (2013.01); C30B 23/02 (2013.01); C30B 35/00 (2013.01); H01L 21/02565 (2013.01); H01L 21/02631 (2013.01)

(58) Field of Classification Search
CPC ......... H01L 21/02565; H01L 21/02631; C23C 14/0021; C23C 14/08; C23C 14/3407; C30B 23/02; C30B 35/00; C30B 29/16; H01B 1/08
USPC ........................................................ 438/478
See application file for complete search history.

(56) References Cited

U.S. PATENT DOCUMENTS

2008/0038906 A1 2/2008 Ichinose et al.
2015/0177311 A1* 6/2015 Ahmed .................. G01N 33/00
324/762.01
2015/0318171 A1* 11/2015 Yamazaki ............. C23C 14/352
204/192.25

FOREIGN PATENT DOCUMENTS

JP 2006-108263 A 4/2006

* cited by examiner

Primary Examiner — Brook Kebede
(74) Attorney, Agent, or Firm — Sughrue Mion, PLLC

(57) ABSTRACT

A sputtering equipment configured to grow a gallium oxide film on a substrate is proposed, and the sputtering equipment may include: a chamber; a stage located in the chamber and configured to secure the substrate thereon; a gallium target located in the chamber and including gallium elements; a first power supply configured to apply voltage to the gallium target; and an oxygen element supplier configured to supply oxygen elements into the chamber.

11 Claims, 5 Drawing Sheets

SPUTTERING EQUIPMENT AND METHOD OF MANUFACTURING SEMICONDUCTOR DEVICE

CROSS-REFERENCE TO RELATED APPLICATION

This application claims priority to Japanese Patent Application No. 2019-067376, filed on Mar. 29, 2019, the entire contents of which are incorporated herein by reference.

TECHNICAL FIELD

The technology herein disclosed relates to a sputtering equipment and a method of manufacturing a semiconductor device.

BACKGROUND

Japanese Patent Application Publication No. 2006-108263 discloses a technology of forming a gallium oxide film by molecular beam epitaxy (MBE).

SUMMARY

Typically, a film-forming speed in the MBE is low. A film-forming speed for the gallium oxide film in the technology in Japanese Patent Application Publication No. 2006-108263 is therefore low. The present specification proposes a technology of forming a gallium oxide film at a higher film-forming speed.

A sputtering equipment disclosed herein is configured to grow a gallium oxide film on a substrate. The sputtering equipment may comprise: a chamber; a stage located in the chamber and configured to secure the substrate thereon; a gallium target located in the chamber and including gallium elements; a first power supply configured to apply voltage to the gallium target; and an oxygen element supplier configured to supply oxygen elements into the chamber.

The above-described oxygen elements may be simple substance oxygen or an oxygen compound. Moreover, the above-described oxygen elements may be atoms, molecules, or radicals. Moreover, the above-described gallium elements may be simple substance gallium or a gallium compound. Moreover, the voltage applied by the above-described first power supply to the above-described gallium target may be direct-current voltage or alternating-current voltage (e.g., radio-frequency voltage).

When a gallium oxide film is to be grown by this sputtering equipment, voltage is applied to the gallium target, so as to cause the gallium target to release gallium elements. The gallium elements released from the gallium target are deposited on a surface of the substrate secured on the stage, so that a film is grown on the surface of the substrate. Moreover, during film formation, oxygen elements are supplied into the chamber by the oxygen element supplier. The oxygen elements are then captured into the film that is growing, and the gallium oxide film is grown on the surface of the substrate. As such, this sputtering equipment enables a gallium oxide film to be grown by sputtering. Because the film-forming speed in sputtering is high, the gallium oxide film can be formed at a high film-forming speed.

Figure 1:
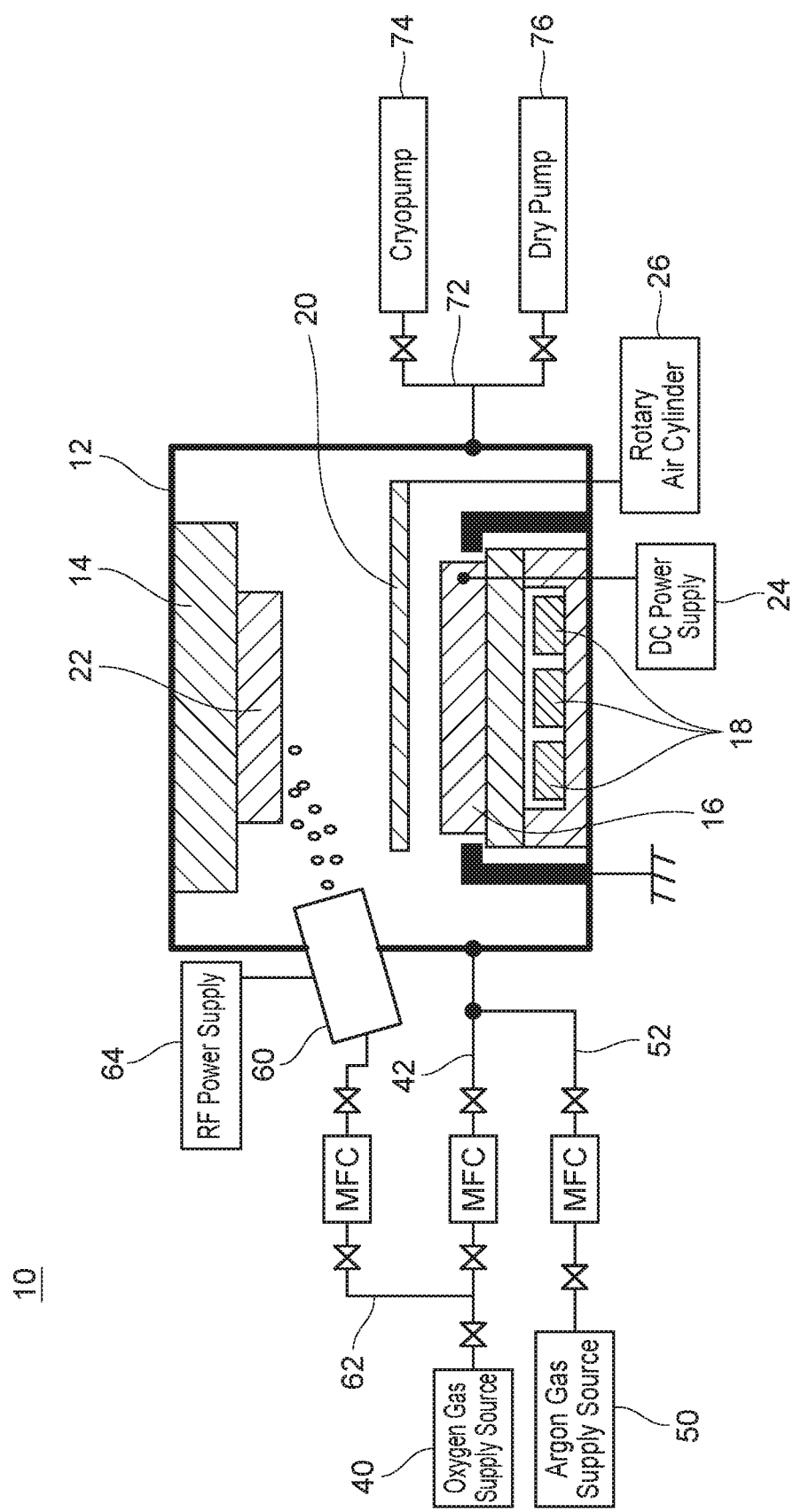
FIG. 1 is a configuration diagram of a sputtering equipment in a first embodiment.

DETAILED DESCRIPTION (First Embodiment) A sputtering equipment 10 in a first embodiment, shown in FIG. 1, comprises a chamber 12. Inside the chamber 12, a stage 14, a target 16, magnets 18, and a shutter 20 are arranged. The stage 14 is configured to secure a substrate 22 thereon. The substrate 22 is secured such that its upper surface is in contact with the stage 14. The sputtering equipment 10 is configured to grow a gallium oxide film on a lower surface of the substrate 22 secured on the stage 14. The stage 14 incorporates a heater, and is configured to heat the substrate 22. The target 16 is located at a position facing the substrate 22 secured on the stage 14. The target 16 is constituted of sintered body of gallium oxide. When ions collide against the target 16, the target 16 releases gallium atoms or gallium oxide molecules. The gallium atoms or gallium oxide molecules released from the target 16 are deposited on the lower surface of the substrate 22, so that a film is grown on the lower surface of the substrate 22. The target 16 is connected to a DC power supply 24 located outside the chamber 12. The DC power supply 24 is configured to apply direct-current voltage to the target 16. The magnets 18 are located below the target 16. The magnets 18 are each a permanent magnet. The magnets 18 generate a magnetic field of approximately 800 G in a horizontal direction in a space near an upper surface of the target 16. The shutter 20 is a plate-like member. The shutter 20 is connected to a rotary air cylinder 26 via a pillar. The rotary air cylinder 26 is configured to rotate the shutter 20. The rotary air cylinder 26 rotates the shutter 20 such that the shutter 20 shifts between a position above the target 16 (a position which covers the target 16) and a position which does not cover the target 16. Shifting the shutter 20 to the position which covers the target 16 will hereinafter be termed "closing the shutter 20." On the other hand, shifting the shutter 20 to the position which does not cover the target 16 will be termed "opening the shutter 20." By closing the shutter 20, sputtering can be stopped. In the state where the shutter 20 is closed, a distance between the shutter 20 and the target 16 is approximately 90 mm.

The sputtering equipment 10 includes an oxygen gas supply source 40 and an argon gas supply source 50. The oxygen gas supply source 40 is connected to the chamber 12 via an oxygen gas supply pipe 42. The oxygen gas supply source 40 is configured to supply oxygen gas ($O_2$ gas) into the chamber 12 via the oxygen gas supply pipe 42. The argon gas supply source 50 is connected to the chamber 12 via an argon gas supply pipe 52. The argon gas supply source 50 is configured to supply argon gas (Ar gas) into the chamber 12 via the argon gas supply pipe 52.

The sputtering equipment 10 includes an oxygen radical gun 60, an oxygen gas supply pipe 62 for radical gun, and an RF power supply 64. The oxygen radical gun 60 is mounted at a wall surface of the chamber 12. The radical-gun oxygen gas supply pipe 62 branches from the oxygen gas supply pipe 42. A downstream end of the radical-gun oxygen gas supply pipe 62 is connected to the oxygen radical gun 60. The radical-gun oxygen gas supply pipe 62 is configured to supply oxygen gas to the oxygen radical gun 60. The RF power supply 64 is configured to supply radio-frequency voltage (RF voltage) to the oxygen radical gun 60. The oxygen radical gun 60 is configured to apply RF voltage to the oxygen gas supplied from the radical-gun oxygen gas supply pipe 62 to thereby generate oxygen radicals. The oxygen radical gun 60 injects oxygen radicals into the chamber 12. The oxygen radical gun 60 injects oxygen radicals toward the lower surface of the substrate 22 secured on the stage 14. Higher RF power supplied by the RF power supply 64 causes a larger amount of oxygen radicals supplied by the oxygen radical gun 60.

Each of the oxygen gas supply pipe 42, the argon gas supply pipe 52, and the radical gun oxygen gas supply pipe 62 includes a valve and a mass flow controller (MFC) installed as appropriate thereat. The valves respectively are configured to open and close the corresponding supply pipes. Moreover, the MFCs respectively control flow rates of gases in the supply pipes to predetermined values.

The sputtering equipment 10 includes a discharge pipe 72, a cryopump 74, and a dry pump 76. The discharge pipe 72 is connected to the chamber 12. The cryopump 74 and the dry pump 76 are connected in parallel with the discharge pipe 72. The cryopump 74 and the dry pump 76 are configured to discharge gas in the chamber 12 to an outside via the discharge pipe 72. The dry pump 76 is a low-vacuum pump, and the cryopump 74 is a high-vacuum pump. By operating the dry pump 76 and then the cryopump 74, a pressure inside the chamber 12 can be reduced up to a high-vacuum state.

Next, a method of growing a gallium oxide film on the lower surface of the substrate 22 by using the sputtering equipment 10 will be described. Various materials can be used for the substrate 22. Description will hereinafter be made on a case where β-type gallium oxide is used as the substrate 22, and the lower surface of the substrate 22 is constituted of a (001) plane. Initially, the substrate 22 is secured onto the stage 14. Next, the dry pump 76 and the cryopump 74 are used to reduce the pressure in the chamber 12 such that the pressure in the chamber 12 becomes $1\times10^{-5}$ Pa or lower. Next, the heater incorporated in the stage 14 is activated to control a temperature of the substrate 22 to approximately 800° C. Next, oxygen gas is supplied from the oxygen gas supply source 40 into the chamber 12, and argon gas is supplied from the argon gas supply source 50 into the chamber 12. Here, gas in which argon gas and oxygen gas are mixed in a 2:1 ratio is supplied into the chamber 12. Next, oxygen radicals are injected by the oxygen radical gun 60 toward the lower surface of the substrate 22. Here, the oxygen radical gun 60 is operated at an RF power of approximately 300 W. Next, a power of approximately 1000 W is fed to tire target 16 by the DC power supply 24. Plasma is thereby generated in the chamber 12.

Next, the shutter 20 is opened. Argon ionized in the plasma then collides against the target 16, and the target 16 releases gallium atoms and gallium oxide molecules. The gallium atoms and gallium oxide molecules, thus released, are deposited on the lower surface of the substrate 22. A film is thereby grown on the lower surface of the substrate 22. Moreover, the gallium atoms released from the target 16 react with the oxygen radicals injected from the oxygen radical gun 60 and the oxygen gas that exists in the chamber 12, and are thus oxidized. A gallium oxide film is thus grown on the lower surface of the substrate 22.

As described above, the sputtering equipment 10 in the first embodiment enables a gallium oxide film to be formed. The grown gallium oxide film can be used to manufacture a semiconductor device. The sputtering equipment 10 enables a gallium oxide film to be grown at a high film-forming speed.

The gallium oxide film grown by the method in the first embodiment underwent an X-ray diffraction analysis. The analysis revealed that the gallium oxide film was constituted of β-type gallium oxide and had its lower surface constituted of a (001) plane. In other words, it was revealed that the gallium oxide film being in crystalline continuity with the substrate 22 was formed. Moreover, the grown gallium oxide film underwent a carrier density analysis by C-V measurements. The analysis revealed that the gallium oxide film was of an n-type and had an n-type carrier concentration of $1\times10^{-15}$ cm$^{-3}$ or lower. Generally, a gallium oxide crystal tends to have oxygen vacancies (defects where oxygen atoms are missing at oxygen sites) formed therein. The oxygen vacancies behave as a donor, and thus when a crystallinity of gallium oxide is low, an n-type carrier density in the gallium oxide becomes high. In contrast to this, the gallium oxide film grown by the above-described method has a low n-type carrier density. It was revealed that the grown gallium oxide film had a few oxygen vacancies and a high crystallinity.

Figure 2:
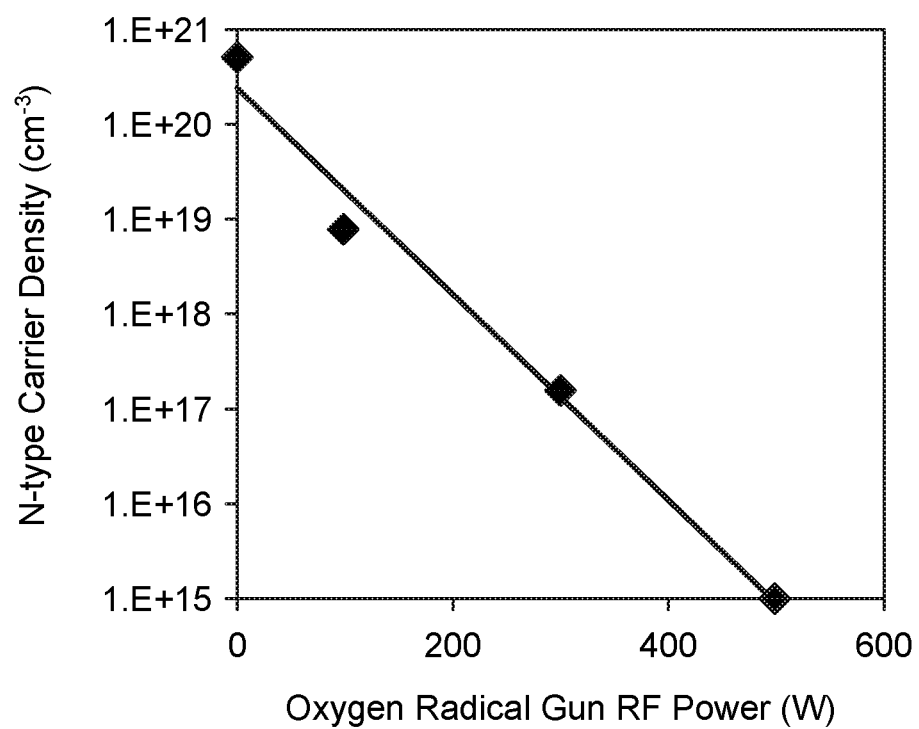
FIG. 2 is a graph showing a relation between RF power for an oxygen radical gun and an n-type carrier density in a gallium oxide film.

FIG. 2 shows a relation between RF power fed to the oxygen radical gun 60 and the n-type carrier density in the gallium oxide film. As shown in FIG. 2, a higher RF power causes a lower n-type carrier density. As mentioned above, the higher RF power causes a larger amount of oxygen radicals supplied by the oxygen radical gun 60. Moreover, the larger amount of supplied oxygen radicals causes a lower density of oxygen vacancies in the gallium oxide film. The lower density of oxygen vacancies causes a lower n-type carrier density in the gallium oxide film. As shown in FIG. 2, higher RF power is thus considered to cause a lower n-type carrier density. Moreover, a larger amount of oxygen gas supplied from the oxygen gas supply pipe 42 into the chamber 12 is considered to cause a lower density of oxygen vacancies in the gallium oxide film, and a lower n-type carrier density in the gallium oxide film. As such, an amount of oxygen elements supplied into the chamber 12 (i.e., the amount of oxygen radicals supplied by the oxygen radical gun 60 and a flow rate of oxygen gas from the oxygen gas supply pipe 42) can be used to control the n-type carrier density in the gallium oxide film.

As described above, the n-type carrier density in the gallium oxide film varies with the amount of supplied oxygen elements. Therefore, by modifying the amount of oxygen elements supplied during film formation, a plurality of gallium oxide films having different n-type carrier densities can formed, continuously. For example, a controller configured to change RF power to be fed to the oxygen radical gun 60 during film formation may be provided so as to continuously form a plurality of gallium oxide films having different n-type carrier densities. Moreover, the flow rate of the oxygen gas to be supplied into the chamber 12 by the oxygen gas supply pipe 42 during film formation may be changed so as to continuously form a plurality of n-type gallium oxide films having different n-type carrier densities.

Figure 3:
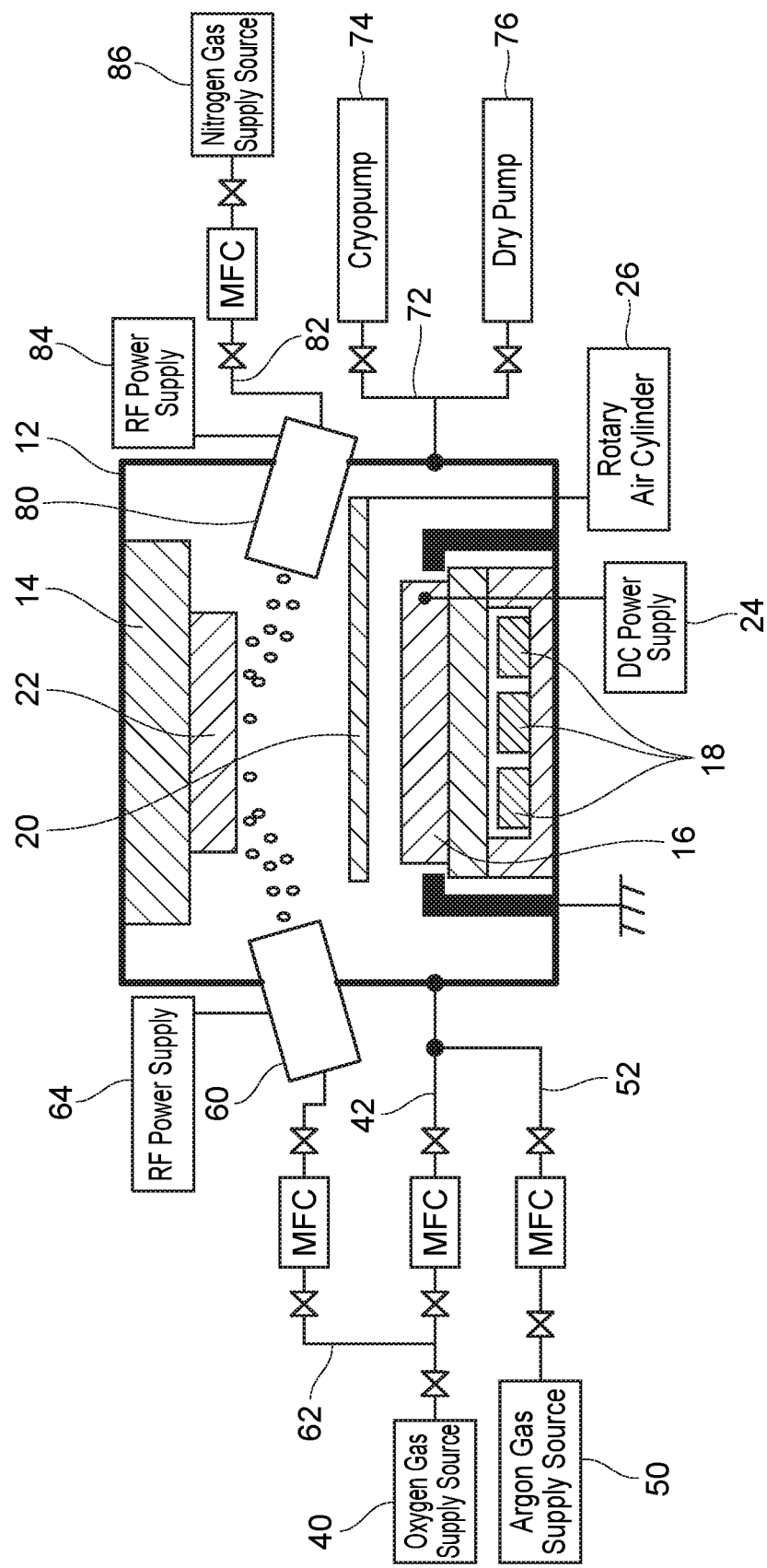
FIG. 3 is a configuration diagram of a sputtering equipment in a second embodiment.

(Second Embodiment) FIG. 3 shows a sputtering equipment in a second embodiment. The sputtering equipment in the second embodiment is capable of growing a p-type gallium oxide film. As shown in FIG. 3, the sputtering equipment in the second embodiment comprises a nitrogen radical gun 80, a nitrogen gas supply pipe 82 for the radical gun, an RF power supply 84, and a nitrogen gas supply source 86. Other configurations of the sputtering equipment in the second embodiment are equal to those of the sputtering equipment 10 in the first embodiment.

The nitrogen radical gun 80 is mounted at a wall surface of the chamber 12. The nitrogen radical gun 80 is connected to the nitrogen gas supply source 86 by the radical-gun nitrogen gas supply pipe 82. The radical-gun nitrogen gas supply pipe 82 is configured to supply nitrogen gas ($N_2$ gas) to the nitrogen radical gun 80. The RF power supply 84 is configured to supply RF voltage to the nitrogen radical gun 80. The nitrogen radical gun 80 applies the RF voltage to the nitrogen gas supplied from the radical-gun nitrogen gas supply pipe 82 so as to generate nitrogen radicals. The nitrogen radical gun 80 is configured to inject nitrogen radicals into the chamber 12. The nitrogen radical gun 80 injects nitrogen radicals toward the lower surface of the substrate 22 secured on the stage 14. Higher RF power supplied by the RF power supply 84 generates a larger amount of nitrogen radicals supplied by the nitrogen radical gun 80. The radical-gun nitrogen gas supply pipe 82 is provided with a valve and an MFC.

A method of growing a gallium oxide film on the lower surface of the substrate 22 by using the sputtering equipment in the second embodiment will be described. Description will hereinafter be made on a case where a gallium oxide substrate having its lower surface constituted of a (001) plane is used as the substrate 22. Initially, as in the first embodiment, processes up to and including actuating the oxygen radical gun 60 are performed. Notably, in the second embodiment, the oxygen radical gun 60 is operated at an RF power of approximately 500 W. Next, nitrogen radicals are injected by the nitrogen radical gun 80 toward the lower surface of the substrate 22. At this occasion, the nitrogen radical gun 80 is operated at an RF power of approximately 50 W. Next, a power of approximately 1000 W is fed to the target 16 by the DC power supply 24. This generates plasma in the chamber 12. Next, the shutter 20 is opened. Gallium atoms and gallium oxide molecules are then released from the target 16, and are deposited on the lower surface of the substrate 22. Similarly to the case in the first embodiment, a gallium oxide film is thus grown on the lower surface of the substrate 22.

When the gallium oxide film is being grown on the lower surface of the substrate 22, the nitrogen radicals injected from the nitrogen radical gun 80 are captured into the gallium oxide film. A gallium oxide film doped with nitrogen is thus grown. The nitrogen behaves as an acceptor in the gallium oxide film. A p-type gallium oxide film is thus grown.

The gallium oxide film grown by the method in the second embodiment underwent an ultimate analysis by SIMS. The analysis revealed that nitrogen atoms were captured into the gallium oxide film at a concentration of $1 \times 10^{18}$ $cm^{-3}$. Moreover, the grown gallium oxide film underwent an X-ray diffraction analysis. The analysis revealed that the gallium oxide film was constituted of β-type gallium oxide and had its lower surface constituted of a (001) plane. In other words, it was revealed that the gallium oxide film being in crystalline continuity with the substrate 22 was formed. Moreover, the grown gallium oxide film underwent a carrier density analysis by C-V measurements. The analysis revealed that V and $C^2$ exhibited a direct proportionality, and a p-type tendency was observed. As such, the sputtering equipment in the second embodiment can form a p-type gallium oxide film.

In the second embodiment as well, the amount of oxygen elements supplied into the chamber 12 (i.e., the amount of oxygen radicals supplied by the oxygen radical gun 60, and the flow rate of oxygen gas from the oxygen gas supply pipe 42) can be used to control the density of oxygen vacancies in the gallium oxide film. Oxygen vacancies behave as a donor, and thus a higher density of oxygen vacancies causes a lower density of p-type carriers in the p-type gallium oxide film. Therefore, the amount of oxygen elements supplied into the chamber 12 can be used to adjust the density of p-type carriers. Moreover, the amount of oxygen elements supplied into the chamber 12 may be changed during film formation so as to continuously form a plurality of p-type gallium oxide films having different effective p-type carrier densities.

In the above-mentioned second embodiment, the nitrogen radical gun 80 is used to supply nitrogen elements into the chamber 12. However, the sputtering equipment in the second embodiment may comprise a nitrogen gas supply pipe configured to supply nitrogen gas ($N_2$) into the chamber 12 in place of or in addition to the nitrogen radical gun 80. The supply of nitrogen gas into the chamber 12 causes nitrogen atoms to be captured into the gallium oxide film from the nitrogen gas, and thus a p-type gallium oxide film can be formed.

Moreover, in the sputtering equipment in the second embodiment, the amount of nitrogen elements supplied into the chamber 12 (i.e., the amount of nitrogen radicals or nitrogen gas supplied) may be changed during film formation so as to continuously form a plurality of p-type gallium oxide films having different effective p-type carrier densities.

(Third Embodiment) A sputtering equipment in a third embodiment uses, as a target 16, a crystalline body of gallium oxide to which zinc oxide (ZnO) is added. The target 16 contains ZnO mixed therein at a concentration of 0.1 wt %. Other configurations of the sputtering equipment in the third embodiment are equal to those of the sputtering equipment 10 in the first embodiment.

A method of growing a gallium oxide film on the lower surface of the substrate 22 by using the sputtering equipment in the third embodiment will be described. Description will hereinafter be made on a case where a gallium oxide substrate having its lower surface constituted of a (001) plane is used as the substrate 22. Similarly to the first embodiment, the processes up to and including opening the shutter 20 are performed. In the third embodiment, the oxygen radical gun 60 is operated at an RF power of approximately 500 W. When the shutter 20 is opened, gallium atoms and gallium oxide molecules released from the target 16 are deposited on the lower surface of the substrate 22, and a gallium oxide film is grown on the lower surface of the substrate 22. Furthermore, zinc atoms are released from the target 16. The zinc atoms released from the target 16 are captured into the gallium oxide film. A gallium oxide film doped with zinc is thus grown. The zinc behaves as an acceptor in the gallium oxide film. A p-type gallium oxide film is thus grown.

The gallium oxide film grown by the method in the third embodiment underwent an ultimate analysis by SIMS. The analysis revealed that zinc atoms were captured into the gallium oxide film at a concentration of $1 \times 10^{20}$ $cm^{-3}$. Moreover, the grown gallium oxide film underwent an X-ray diffraction analysis. The analysis revealed that the gallium oxide film was constituted of β-type gallium oxide and had its lower surface constituted of a (001) plane. In other words, it was revealed that a gallium oxide film being in crystalline continuity with the substrate 22 was formed. Moreover, the grown gallium oxide film underwent a carrier density analysis by C-V measurements. The analysis revealed that V and $C^2$ exhibited a direct proportionality, and a p-type tendency was observed. As such, the sputtering equipment in the third embodiment can form a p-type gallium oxide film.

Figure 4:
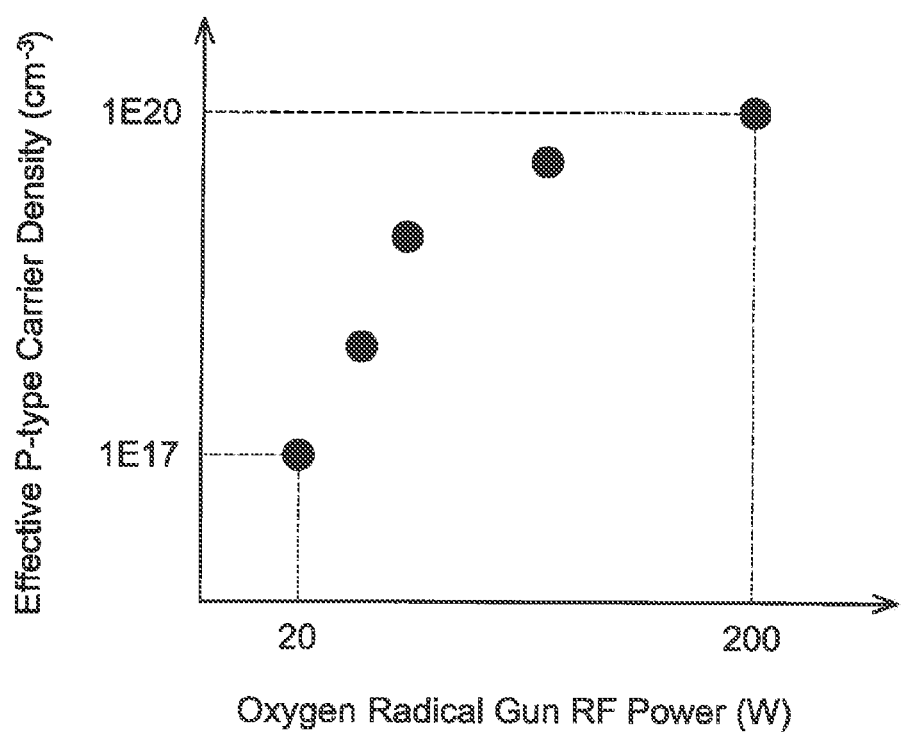
FIG. 4 is a graph showing a relation between RF power for an oxygen radical gun and an effective p-type carrier density in a gallium oxide film.

FIG. 4 shows a relation between the RF power fed to the oxygen radical gun 60 and the effective p-type carrier density in the gallium oxide film. As shown in FIG. 4, a higher RF power causes a higher effective p-type carrier density. As mentioned above, higher RF power causes a larger amount of oxygen radicals supplied by the oxygen radical gun 60. Moreover, the larger amount of supplied oxygen radicals causes a lower density of oxygen vacancies in the gallium oxide film. The oxygen vacancies behave as a donor in the gallium oxide film, and thus the lower density of oxygen vacancies causes a higher effective p-type carrier density in the p-type gallium oxide film. As shown in FIG. 4, higher RF power is thus considered to cause a higher effective p-type carrier density. Moreover, a larger amount of oxygen gas supplied from the oxygen gas supply pipe 42 into the chamber 12 is considered to cause a lower density of oxygen vacancies in the gallium oxide film, and a higher effective p-type carrier density in the gallium oxide film. As such, the effective p-type carrier density in the gallium oxide film can be controlled by using the amount of oxygen elements supplied into the chamber 12 (i.e., the amount of oxygen radicals supplied by the oxygen radical gun 60, and the flow rate of oxygen gas from the oxygen gas supply pipe 42). Moreover, the amount of oxygen elements supplied into the chamber 12 may be changed during film formation so as to continuously form a plurality of p-type gallium oxide films having different effective p-type carrier densities.

Although the target 16 contains zinc oxide in the third embodiment, the target 16 may contain another substance that can dope the gallium oxide film with an acceptor. For example, the target 16 may contain acceptor elements such as calcium, zinc, magnesium, copper, iron, or a compound of these acceptor elements. The substance that can dope an acceptor may be contained in the target 16 at a concentration of 0.01 to 5 wt %.

Figure 5:
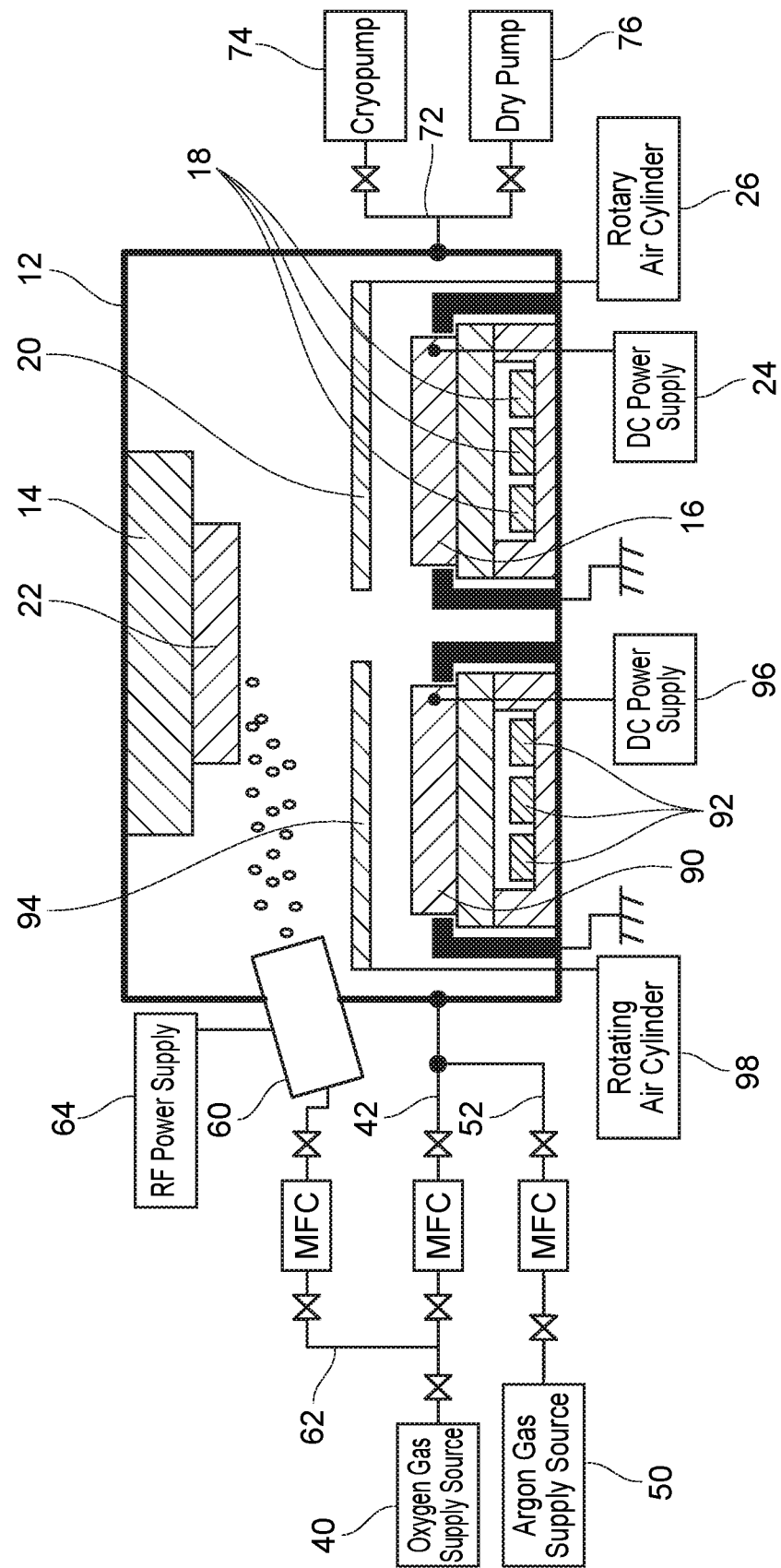
FIG. 5 is a configuration diagram of a sputtering equipment in a fourth embodiment.

(Fourth Embodiment) FIG. 5 shows a sputtering equipment in a fourth embodiment. The sputtering equipment in the fourth embodiment is capable of growing a p-type gallium oxide film. As shown in FIG. 5, the sputtering equipment in the fourth embodiment comprises a target 90, magnets 92, a shutter 94, a DC power supply 96, and a rotary air cylinder 98. Other configurations of the sputtering equipment in the fourth embodiment are equal to those of the sputtering equipment 10 in the first embodiment.

The target 90 is installed in the chamber 12. The target 90 is located adjacent to the target 16, and is located at a position facing the substrate 22 secured on the stage 14. The target 90 is constituted of sintered body of zinc oxide (ZnO). When ions collide against the target 90, the target 90 releases zinc atoms therefrom. The target 90 is connected to the DC power supply 96 located outside the chamber 12. The DC power supply 96 is configured to apply direct-current voltage to the target 90. In other words, the DC power supply 96 for the target 90 is provided separately from the DC power supply 24 for the target 16. Power fed to the target 90 can thereby be controlled independently of power fed to the target 16. The magnets 92 are located below the target 90, and generate a magnetic field in a horizontal direction in a space in vicinity of an upper surface of the target 90. The shutter 94 is a plate-like member, and is configured to be rotated by the rotary air cylinder 98. The rotary air cylinder 98 is configured to open and close the shutter 94.

A method of growing a gallium oxide film on the lower surface of the substrate 22 by using the sputtering equipment in the fourth embodiment will be described. Description will hereinafter be made on a case where a gallium oxide substrate having its lower surface constituted of a (001) plane is used as the substrate 22. Initially, similarly to the first embodiment, processes up to and including feeding a power of approximately 1000 W to the target 16 by the DC power supply 24 are performed. In the fourth embodiment, the oxygen radical gun 60 is operated at an RF power of approximately 500 W. The feeding of power to the target 16 generates plasma on the target 16. Next, a power of approximately 100 W is fed to the target 90 by the DC power supply 96. Plasma is thereby generated on the target 90. Next, the two shutters 20, 94 are opened. Ionized argon then collides against the target 16, and the target 16 releases gallium atoms and gallium oxide molecules. Simultaneously, ionized argon collides against the target 90, and the target 90 releases zinc atoms. The gallium atoms and gallium oxide molecules, thus released, are deposited on the lower surface of the substrate 22. A gallium oxide film is thereby grown on the lower surface of the substrate 22. Moreover, the zinc atoms released from the target 90 are captured into the gallium oxide film. A gallium oxide film doped with zinc is thus grown. The zinc behaves as an acceptor in the gallium oxide film. A p-type gallium oxide film is thus grown.

The gallium oxide film grown by the method in the fourth embodiment underwent an ultimate analysis by the SIMS. The analysis revealed that zinc atoms were captured into the gallium oxide film at a concentration of $5 \times 10^{19}$ cm$^{-3}$. Moreover, the grown gallium oxide film underwent an X-ray diffraction analysis. The analysis revealed that the gallium oxide film was constituted of β-type gallium oxide and had its lower surface constituted of a (001) plane. In other words, it was revealed that the gallium oxide film being in crystalline continuity with the substrate 22 was formed. Moreover, the grown gallium oxide film underwent a carrier density analysis by C-V measurements. The analysis revealed that V and $C^2$ exhibited a direct proportionality, and a p-type tendency was observed. As such, the sputtering equipment in the fourth embodiment can form a p-type gallium oxide film.

The sputtering equipment in the fourth embodiment can control the power fed to the target 90 independently of the power fed to the target 16. This enables an amount of zinc atoms supplied to the lower surface of the substrate 22 to be controlled independently. Therefore, the p-type impurity concentration in the growing gallium oxide film can be controlled to a desired value.

In the fourth embodiment as well, the density of oxygen vacancies in the gallium oxide film can be controlled by using the amount of oxygen elements supplied into the chamber 12 (i.e., the amount of oxygen radicals supplied by the oxygen radical gun 60, and the flow rate of oxygen gas from the oxygen gas supply pipe 42). Oxygen vacancies behave as a donor, and thus a higher density of oxygen vacancies causes a lower density of p-type carriers in the p-type gallium oxide film. Therefore, the amount of oxygen elements supplied into the chamber 12 can be used to adjust the density of p-type carriers. Moreover, the amount of oxygen elements supplied into the chamber 12 may be changed during film formation so as to continuously form a plurality of p-type gallium oxide films having different effective p-type carrier densities.

Although the target 90 contains zinc oxide in the fourth embodiment, the target 90 may contain another substance that can dope the gallium oxide film with an acceptor. For example, the target 90 may contain acceptor elements such as calcium, zinc, magnesium, copper, iron, or a compound of these acceptor elements.

Moreover, although the shutters 20, 94 are simultaneously opened in the above-mentioned fourth embodiment, the shutters 20, 94 may be alternately opened. This configuration can form a film in which a gallium oxide film and a zinc oxide film are alternately stacked.

The sputtering equipment in each of the above-mentioned first to fourth embodiments includes the oxygen radical gun 60 and the oxygen gas supply pipe 42 as means for supplying oxygen elements into the chamber 12. However, the means for supplying oxygen elements into the chamber 12 may only be either one of the oxygen radical gun 60 and the oxygen gas supply pipe 42. Moreover, ozone gas ($O_3$ gas) may be supplied into the chamber 12 in place of oxygen gas ($O_2$ gas). Moreover, another gas containing oxygen atoms may be supplied into the chamber 12.

Moreover, although the substrate 22 is constituted of gallium oxide in each of the above-mentioned first to fourth embodiments, the substrate 22 may be constituted of another substance.

Moreover, although argon is supplied as the sputtering gas into the chamber 12 in each of the above-mentioned first to fourth embodiments, another inert gas may serve as the sputtering gas. As the sputtering gas, helium, argon, krypton, xenon, or mixed gas containing at least one of them may also be used.

Moreover, although direct-current voltage is applied to each target in the above-mentioned embodiments, radio-frequency voltage may be applied to each target.

Correspondence between constituent features in the above-mentioned embodiments and constituent features in the claims will be described. The target 16 in the first to fourth embodiments is an example of a gallium target in the claims. The DC power supply 24 in the first to fourth embodiments is an example of a first power supply in the claims. The oxygen radical gun 60 and the oxygen gas supply pipe 42 in the first to fourth embodiments are an example of an oxygen element supplier in the claims. The nitrogen radical gun 80 in the second embodiment is an example of a nitrogen element supplier in the claims. The nitrogen gas supply pipe configured to supply nitrogen gas into the chamber 12, which has been described in connection with the second embodiment, is also an example of the nitrogen element supplier in the claims. The target 90 in the fourth embodiment is an example of an acceptor target in the claims.

Some of the technological elements herein disclosed will hereinafter be enumerated. The following technological elements are independently useful.

In an example of the sputtering equipment disclosed herein, the oxygen element supplier may be configured to supply oxygen radicals into the chamber.

Further, in another example of the sputtering equipment herein disclosed, the oxygen element supplier may be configured to supply oxygen-containing gas into the chamber. The oxygen-containing gas is gas containing oxygen atoms, and includes oxygen gas ($O_2$ gas), ozone gas ($O_3$ gas), for example.

The sputtering equipment may include both the oxygen element supplier configured to supply oxygen radicals and the oxygen element supplier configured to supply oxygen-containing gas.

An example of the sputtering equipment disclosed herein may further comprise a nitrogen element supplier configured to supply nitrogen elements into the chamber.

Nitrogen functions as an acceptor in the gallium oxide film. The supply of nitrogen elements into the chamber causes the nitrogen elements to be captured into the gallium oxide film, and can form the gallium oxide film into a p-type.

In an example of the sputtering equipment disclosed herein, the nitrogen element supplier may be configured to supply nitrogen radicals into the chamber.

Further, in another example of the sputtering equipment herein disclosed, the nitrogen element supplier may be configured to supply nitrogen gas into the chamber.

The sputtering equipment may include both the nitrogen element supplier configured to supply nitrogen radicals and the nitrogen element supplier configured to supply nitrogen gas.

In an example of the sputtering equipment disclosed herein, the gallium target may include elements functioning as an acceptor in gallium oxide.

If the gallium target contains the elements functioning as an acceptor (acceptor elements) in the gallium oxide, the acceptor elements are captured into the gallium oxide film. This can form the gallium oxide film into a p-type.

An example of the sputtering equipment disclosed herein may further comprise: an acceptor target located in the chamber and including elements functioning as an acceptor in gallium oxide; and a second power supply configured to apply a voltage to the acceptor target. The voltage applied to the acceptor target by the second power supply may be direct-current voltage or alternating-current voltage (e.g., radio-frequency voltage).

If the acceptor target exists, elements generated from the acceptor target (acceptor elements) are supplied to the surface of the substrate, and the acceptor elements are captured into the gallium oxide film. This enables the gallium oxide film to be of a p-type. Moreover, the voltage applied to the gallium target (the voltage applied by the first power supply) can be made different from the voltage applied to the acceptor target (the voltage applied by the second power supply), by which the amount of gallium elements and the amount of acceptor elements supplied to the surface of the substrate can be controlled individually. Therefore, the concentration of the acceptor elements in the gallium oxide film can be controlled to an intended concentration.

An example of the sputtering equipment disclosed herein may further comprise a supply amount controller configured to change an amount of the oxygen elements supplied into the chamber by the oxygen element supplier during film formation.

Oxygen vacancies where oxygen sites are not filled with oxygen are formed in the gallium oxide film. The oxygen vacancies in the gallium oxide film behave as a donor. A larger amount of oxygen elements supplied during film formation causes a fewer oxygen vacancies, and accordingly a lower n-type carrier concentration in the gallium oxide film. For example, if an n-type gallium oxide film is to be grown, a smaller amount of oxygen elements supplied into the chamber causes a higher density of oxygen vacancies, and accordingly a higher n-type carrier concentration in the gallium oxide film. Meanwhile, if a p-type gallium oxide film is to be grown, n-type impurities (oxygen vacancies) function as a counter dopant against p-type impurities. Therefore, if a p-type gallium oxide film is to be grown, a smaller amount of oxygen elements supplied into the chamber causes a higher density of oxygen vacancies, and accordingly a lower p-type carrier concentration in the gallium oxide film. As such, properties of a growing gallium oxide film vary according to the amount of oxygen elements supplied into the chamber. By changing the amount of oxygen elements supplied during film formation as described above, a plurality of gallium oxide films having different properties can be formed continuously.

Further, a method of forming a semiconductor device is proposed herein. An example of the formation method may comprise growing a gallium oxide film on a surface of a substrate secured on a stage by depositing gallium elements generated from a gallium target on the surface of the substrate while supplying the oxygen elements into the chamber by an oxygen element supplier and applying voltage to the gallium target by the first power supply.

This manufacturing method can form the gallium oxide film at a high film-forming speed.

Further, in an example of the formation method disclosed herein, during the growing of the gallium oxide film, an amount of the oxygen elements supplied by the oxygen element supplier into the chamber may be changed.

Changing the amount of supplied oxygen elements, as such, enables a plurality of gallium oxide films having different properties to be formed continuously.

While specific examples of the present disclosure have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present disclosure is not limited to the combinations described at the time the claims are filed. Further, the purpose of the examples illustrated by the present description or drawings is to satisfy multiple objectives simultaneously, and satisfying any one of those objectives gives technical utility to the present disclosure.

What is claimed is:

1. A sputtering equipment configured to grow a gallium oxide film on a substrate, the sputtering equipment comprising:
    a chamber;
    a stage located in the chamber and configured to secure the substrate thereon;
    a gallium target located in the chamber and including gallium elements;
    a first power supply configured to apply voltage to the gallium target; and
    an oxygen element supplier configured to supply oxygen elements into the chamber.

2. The sputtering equipment or claim 1, wherein the oxygen element supplier is configured to supply oxygen radicals into the chamber.

3. The sputtering equipment of claim 1, wherein the oxygen element supplier is configured to supply oxygen-containing gas into the chamber.

4. The sputtering equipment of claim 1, further comprising a nitrogen element supplier configured to supply nitrogen elements into the chamber.

5. The sputtering equipment of claim 4, wherein the nitrogen element supplier is configured to supply nitrogen radicals into the chamber.

6. The sputtering equipment of claim 4, wherein the nitrogen element supplier is configured to supply nitrogen gas into the chamber.

7. The sputtering equipment of claim 1, wherein the gallium target includes elements functioning as an acceptor in gallium oxide.

8. The sputtering equipment of claim 1, further comprising:
    an acceptor target located in the chamber and including elements functioning as an acceptor in gallium oxide; and
    a second power supply configured to apply a voltage to the acceptor target.

9. The sputtering equipment of claim 1, further comprising a supply amount controller configured to change an amount of the oxygen elements supplied into the chamber by the oxygen element supplier during film formation.

10. A method of manufacturing a semiconductor device by growing a gallium oxide film on a substrate by a sputtering equipment that comprises:
    a chamber;
    a stage located in the chamber and configured to secure the substrate thereon;
    a gallium target located in the chamber and including gallium elements;
    a first power supply configured to apply voltage to the gallium target; and
    an oxygen element supplier configured to supply oxygen elements into the chamber,
    the manufacturing method comprising:
    growing the gallium oxide film on a surface of the substrate secured on the stage by depositing gallium elements generated from the gallium target on the surface of the substrate while supplying the oxygen elements into the chamber by the oxygen element supplier and applying voltage to the gallium target by the first power supply.

11. The method of claim 10, wherein, during the growing of the gallium oxide film, an amount of the oxygen elements supplied by the oxygen element supplier into the chamber is changed.

* * * * *